United States Patent
Nishimura et al.

Patent Number: 5,364,433
Date of Patent: Nov. 15, 1994

[54] OPTICAL MEMBER OF SYNTHETIC QUARTZ GLASS FOR EXCIMER LASERS AND METHOD FOR PRODUCING SAME

[75] Inventors: Hiroyuki Nishimura; Akira Fujinoki; Toshikatsu Matsuya; Kyoichi Inaki; Toshiyuki Kato; Atsushi Shimada, all of Fukushima, Japan

[73] Assignee: Shin-Etsu Quartz Products Company Limited, Tokyo, Japan

[21] Appl. No.: 977,397
[22] PCT Filed: Jun. 29, 1992
[86] PCT No.: PCT/JP92/00821
    § 371 Date: Mar. 15, 1993
    § 102(e) Date: Mar. 15, 1993
[87] PCT Pub. No.: WO93/00307
    PCT Pub. Date: Jan. 7, 1993

[30] Foreign Application Priority Data

Jun. 29, 1991 [JP] Japan .................. 3-182858
Aug. 31, 1991 [JP] Japan .................. 3-299997

[51] Int. Cl.⁵ ............................. C03C 3/06
[52] U.S. Cl. ................. 65/17.4; 65/DIG. 8; 501/900; 501/54
[58] Field of Search ........... 501/54, 900; 423/336, 423/337; 65/DIG. 8, 14.2

[56] References Cited
U.S. PATENT DOCUMENTS

4,317,668  3/1982  Susa et al. ............... 501/54

FOREIGN PATENT DOCUMENTS

58-161937  9/1983  Japan .
59-92941   5/1984  Japan .
61-251538 11/1986  Japan .
100436     5/1987  Japan ............ 501/54
2-69332    3/1990  Japan .
80343      3/1990  Japan ............ C03C 3/06
34419      2/1991  Japan ............ 501/54

*Primary Examiner*—Mark L. Bell
*Assistant Examiner*—C. M. Bonner
*Attorney, Agent, or Firm*—Scully, Scott, Murphy & Presser

[57] ABSTRACT

A synthetic quartz glass optical member for an ultraviolet laser, suitably applicable as a stepper lens of a lithographer using an excimer laser beam and other optical members, wherein the quartz glass has a hydroxyl content of 10 to 100 ppm, a chlorine content of 200 ppm or less, a hydrogen content of $1 \times 10^{16}$ molecules/cm³ or less, a homogeneity of refractive index of $5 \times 10^{-6}$ or less in terms of $\Delta n$, and a birefringence of 5 nm/cm or less. The optical member can be produced by subjecting a volatile silicon compound to flame hydrolysis with oxyhydrogen flame, depositing the formed particulate silica on a heat-resistant support to prepare a porous silica matrix, heating the matrix in a vacuum as high as $1 \times 10^{-2}$ Torr or above to a temperature of 1,400 °C. or above to effect dehydration and degassing, homogenizing the resultant transparent quartz glass into highly homogeneous quartz glass free from striae in at last one direction, molding the highly homogeneous quartz glass, and annealing the molded glass.

4 Claims, 4 Drawing Sheets

FIG.1

◇: EXAMPLE 1
♦: COMPARATIVE EXAMPLE 2

○ : EXAMPLE 1
● : COMPARATIVE EXAMPLE 2

OPTICAL MEMBER OF SYNTHETIC QUARTZ GLASS FOR EXCIMER LASERS AND METHOD FOR PRODUCING SAME

TECHNICAL FIELD

The present invention relates to a synthetic quartz glass optical member which is very stable against irradiation with ultraviolet laser beams having oscillation wavelengths of not more than 300 nm and a method for producing the same and more specifically to an optical member of synthetic quartz glass which is very stable against irradiation with KrF excimer laser beams and ArF excimer laser beams and a method for producing the same.

The present invention further pertains to a method for producing a quartz glass member suitably used as an optical members such as a window, a mirror, a lense and a prism which constitute an optical system of a lithography device provided with, in particular, an excimer laser as a light source and used for producing semiconductor chips.

BACKGROUND ART

Along with a recent increase in the degree of integration of LSI's, these has been required a technique which permits display of accurate images, for instance, with minute lines of a width on the order of submicrons in a photolithography technique or a lithography technique for displaying an integrated circuit patter on a wafer. In the photolithography technique, an attempt has accordingly been done to adopt light rays of short wavelengths as light sources for exposure systems in order to form accurate images by lines having such a quite narrow width. There have been required, for instance, a stepper lense for lithography to have excellent transparency to ultraviolet rays, uniform refractive index distribution for ultraviolet rays, in particular, ultraviolet laser beams and high durability to the irradiation of ultraviolet laser beams in order to display, on a wafer, accurate and clear distortion-free images of integrated circuit patterns by fine lines without light and dark irregularities.

However, a lense made from a conventional optical glass currently used has very low transmittance to ultraviolet rays. For instance, when using ultraviolet rays having wavelengths falling within the wavelength range shorter than 365 nm (i-ray), the transmittance to ultraviolet rays is abruptly reduced during operating the optical system and it is thus substantially impossible to use such a lense as a stepper lense. In particular, when using ultraviolet rays having wavelengths falling within the wavelength range shorter than 365 nm (i-ray), the lense generates heat through absorption of the irradiated ultraviolet rays. This leads to changes of optical characteristics of the optical lense and in turn becomes a cause of a deviation of the focal length thereof. For this reason, quartz glass has been used as a material for producing parts through which ultraviolet rays are transmitted.

However, the quartz glass made of a naturally-occurring rock crystal has a low transmittance to ultraviolet rays having wavelengths of not more than 250 nm, further begins to absorb lights in the ultraviolet region during irradiation with ultraviolet rays and the ultraviolet transmission rate thereof is further reduced. It has thus been substantially impossible to use such quartz glass as a material for producing a stepper lense. It is believed that the quartz glass made of a naturally-occurring rock crystal absorbs light rays in the ultraviolet region due to impurities present in the quartz glass and for this reason, synthetic quartz glass having a low impurity-content, i.e., synthetic silica glass has been used for producing optical members which are used in the ultraviolet region.

In order to prevent any contamination with metallic impurities, the presence of which in general becomes a cause of the ultraviolet absorption, the synthetic quartz glass has been prepared by directly introducing, into an oxyhydrogen flame, vapor of a volatile, highly pure silicon compound which is chemically synthesized and purified through distillation, for instance, a silicon halides such as silicon tetrachloride ($SICl_4$); an alkoxysilane such as ethoxysilane ($Si(OC_2H_5)_4$), methoxysilane ($Si(OCH_3)_4$) or the like; or an alkylalkoxysilane such as methyltrimethoxysilane ($SiCH_3(OCH_3)3$), ethyltriethoxysilane ($SiC_2H_5(OC2H5)_3$) or the like to cause flame-hydrolysis by the action of the oxyhydrogen flame, depositing and melting glass fine particles formed through the decomposition of the compound on a heat-resistant rod-like core material to give a transparent glass material. Alternatively, it is also possible to form a transparent glass material by depositing the foregoing glass fine particles on a heat-resistant rodlike core material to give a porous glass material and then heating and melting the porous glass material in an electric furnace.

The transparent synthetic quartz glass thus produced is quite pure, almost free of metallic impurities and can effectively transmit lights in a short wavelength region on the order of about 190 nm. Therefore, the synthetic quartz glass has been used as a material for transmitting lights from ultraviolet lasers, more specifically, excimer lasers such as KrF lasers (248 nm), XeCl lasers (308 nm), XeBr lasers (282 nm), XeF lasers (351, 353 nm) and ArF lasers (193 nm); and 4-fold higher harmonics (250 nm) of YAG lasers in addition to the foregoing i-line.

For instance, an attempt has been done to synthesize highly pure quartz glass having a content of elemental metallic impurities of not more than 0.1 ppm and comprising OH groups in a predetermined concentration by improving the purity of silicon tetrachloride as a starting material and controlling the conditions for flame-hydrolysis by an oxyhydrogen flame and to thus produce quartz glass parts for optical use having improved durability to lights from ultraviolet lasers (Japanese Unexamined Patent Publication No. Hei 1-167258).

Although the quartz glass parts for optical use prepared according to these methods exhibit excellent durability to lights from ultraviolet lasers, the production thereof requires an increase of the production processes. Therefore, they suffer from various problems from the viewpoint of production techniques and production time as well as on the economical standpoint.

Incidentally, the synthetic quartz glass likewise begins to absorb ultraviolet rays in a certain region upon irradiation with ultraviolet rays. This new absorption band within the ultraviolet region which is absorbed by the synthetic quartz glass would be exceptionally caused due to the presence of structures formed from components of the quartz glass other than $SiO_2$ such as SiOH or SICl, or intrinsic defects due to oxygen excess- or deficient-structures such as Si—Si and Si—O—O—Si, which possibly generate paramagnetic defects through optical reactions. There have been detected and identified, by ESR spectrometry or the like, various paramagnetic defects in the synthetic quartz glass which become a cause of light absorption, for instance, E' center (Si·) and NBOHC (Si—O).

As has been explained above, the paramagnetic defects in general have optical absorption bands. There have been known, for instance, an absorption at E' center, 215 nm, and at 260 nm (which has not yet been correctly identified) as examples of such absorption bands due to the paramagnetic defects in quartz glass falling within the ultraviolet region, which are observed upon irradiation thereof with ultraviolet rays. These absorption bands are relatively broad and strong and, therefore, this becomes a serious problem when it is used as a material for transmitting lasers such as ArF lasers (193 nm) and KrF lasers (248 nm).

For the foregoing reasons, the synthetic quartz glass used for excimer lasers must have high durability to ultraviolet rays such that it does not cause any new absorption band even when it is irradiated with strong ultraviolet rays such as light rays from ultraviolet lasers.

An object of the present invention is to provide an optical quartz glass optical members used in an optical system provided with an ultraviolet laser represented by an excimer laser as a light source, which permits the solution of the problem of the reduction in the ultraviolet transmission rate of the quartz glass optical member observed when it is irradiated with ultraviolet rays.

DISCLOSURE OF THE INVENTION

The inventors of this invention have conducted intensive studies to solve the foregoing problem, have found out that hydroxyl groups (OH groups) and chlorine atoms serve as impurities which are linked to intrinsic defects present in the synthetic quartz glass and that quartz glass having excellent resistance to excimer laser rays can be obtained by reducing the OH group-content of the synthetic quartz glass to 10 to 100 ppm, reducing the chlorine-content thereof to not more than 200 ppm and designing the quartz glass so as to have uniform refractive index distribution on the order of not more than $5 \times 10^{-6}$ as expressed in terms of $\Delta n$ and a birefringence of not more than 5 nm/cm and thus have completed the present invention.

According to the present invention, there is thus provided synthetic quartz glass used as a material for producing optical members for excimer lasers, which allows suppression of reduction in the ultraviolet transmission rate upon irradiation with lights from excimer lasers as much as possible as well as a method for producing the same. More particularly, the present invention provides an optical quartz glass optical member suitably used for producing a stepper lense for excimer lasers and a method for the preparation thereof.

The present invention relates to an optical member for excimer lasers made from synthetic quartz glass which has a hydroxyl group-content ranging from 10 to 100 ppm, a chlorine-content of not more than 200 ppm, a hydrogen molecule-content of not more than $1 \times 10^{16}$ molecules/cm$^3$, a uniformity of refractive index distribution on the order of not more than $5 \times 10^{-6}$ as expressed in terms of $\Delta n$ and a birefringence of not more than 5 nm/cm. The present invention also relates to a method for producing an optical member for excimer lasers made from synthetic quartz glass which has a hydroxyl group-content ranging from 10 to 100 ppm, a chlorine-content of not more than 200 ppm, a hydrogen molecule-content of not more than $1 \times 10^{16}$ molecules/cm$^3$, a uniformity of refractive index distribution on the order of not more than $5 \times 10^{-6}$ as expressed in terms of $\Delta n$ and a birefringence of not more than 5 nm/cm. The method comprises the steps of flame-hydrolyzing a volatile silicon compound using an oxyhydrogen flame to form fine silica particles, depositing the fine silica particles on a heat-resistant substrate to give a porous silica ingot, dehydrating and degasifying by heating the porous silica ingot at a temperature of not less than 1400° C and a high degree of vacuum on the order of not less than $1 \times 10^{-2}$ Torr to thus vitrify the ingot, then uniformizing the dehydrated, degasified transparent quartz glass to give highly uniform quartz glass free of stria in at least one direction thereof, molding the resulting highly uniform quartz glass and annealing the molded quartz glass article.

The inventors of this invention have found out that if the internal light transmittance (as determined at 245 nm) of the synthetic quartz glass from which the foregoing optical member is produced is not less than 99%, the stability of the synthetic quartz glass against the lights from excimer lasers is further improved. It is generally believed that the absorption band at 245 nm is an absorption due to oxygen-deficiency. The inventors of this invention have found out that optical material free of this absorption is preferably used for the production of optical members for excimer lasers.

The inventors of this invention have found out that the lower the OH group-content and chlorine-content in the synthetic quartz glass (for instance, not more than 5 ppm for both contents), the higher the durability thereof to the lights from excimer lasers, but it is sufficient for the achievement of stable transmittance of the glass for the lights from excimer lasers to control the OH group-content to 10 to 100 ppm and the chlorine-content to not more than 200 ppm. With regard to, in particular, the content of OH groups which are involved in the light absorption due to the intrinsic defects, it has been found that the synthetic quartz glass having the OH group-content ranging from 10 to 200 ppm ensures acceptable durability to the lights from excimer lasers. However, the OH group-content preferably ranges from 10 to 100 ppm in order to obtain more stable optical members for the excimer lasers which do not exhibit light absorption due to intrinsic defects even if they are operated over a long time period and which ensure good uniformity of refractive index and good birefringence over a long time.

In the present invention, the hydrogen molecule-content of the synthetic quartz glass optical member is limited to not more than $1 \times 10^{16}$ molecules/cm$^3$. The limitation of the hydrogen molecule-content to not more than $1 \times 10^{16}$ molecules/cm$^3$ ensures the suppression of any reduction of light transmittance in the ultraviolet region possibly observed when an increase in the pulse numbers of the irradiated light from an excimer laser exceeds $1 \times 10^5$ pulses at 500 mJ.

It has generally been required for the optical members used in lithography apparatus for semiconductors to have severe uniformity in order to ensure uniform exposure and to prevent any scattering of the resistance to the lights from excimer lasers. However, the inventors have found out that the resistance to excimer laser rays of the optical member can be regarded as being uniform, if the refractive index distribution determined at the light-transmitting plane of the synthetic quartz glass optical member is not more than $5 \times 10^{-6}$ as expressed in terms of refractive index difference $\Delta n$ between the maximum and minimum refractive indices thereof. In other words, if the value of Δn is not more than $5 \times 10^{-6}$ OH groups and chlorine atoms which are adversely affect the stability of the synthetic quartz glass optical member against ultraviolet rays are approximately uniformly distributed throughout the part and thus the optical member ensures uniform and overall durability to the lights from excimer lasers. Moreover, the foregoing uniform refractive index distribution is favorable for optical members such as lenses.

As materials for synthetic quartz glass used in the production of synthetic quartz glass optical members for excimer lasers, usable in the present invention, thereby may be used, for instance, volatile silicon compounds such as alkylpolyalkoxysilanes or alkoxysilanes (e.g., methyltrimethoxysilane [Si(CH$_3$)(OCH$_3$)$_3$] and tetramethoxysilane [Si(OCH$_3$)$_4$]); or other silane compounds; or volatile inorganic silicon compounds (e.g., silicon tetrachloride).

According to the present invention, a volatile silicon compound is vaporized and hydrolyzed through the direct flame-hydrolyzation technique to give fine particles of silica Glass, followed by deposition of the silica glass on a heat-resistant substrate to form a rod-like porous ingot of synthetic silica glass, so-called "soot".

In the present invention, the porous synthetic silica Glass ingot can be produced according to, for instance, the vapor-phase axial deposition technique (VAD method) and the outside vapor deposition technique (outside CVD method). However, the present invention is not restricted to these specific methods since it is sufficient that the porous synthetic silica Glass ingot used in the invention is a porous bulk material of synthetic silica glass.

In the present invention, the porous synthetic silica glass ingot comprises OH groups formed through the oxyhydrogen flame treatment and thus the OH groups present therein must be removed in order to prevent the formation of intrinsic defects due to the presence of these OH groups.

With regard to glass for the production of optical fibers, the reduction of OH groups in the Glass to a level as low as possible is conventionally carried out by heat-treating the glass in a chlorine gas atmosphere (chlorine gas, Cl$_2$, serves as a dehydrating agent) during the step for synthesis of porous silica glass or the step for vitrification into transparent glass. This method permits the reduction of the OH group-content in the glass, but chlorine gas remains in the resulting glass and this accordingly becomes a cause of the formation of intrinsic defects in the glass. Alternatively, the glass may be heat-treated in an inert gas, but the inert gas is dissolved in the glass so far as the treatment is carried out at ordinary pressure. This likewise becomes a cause of intrinsic defects.

On the other hand, the porous silica glass ingot comprises, in addition to OH groups, a substantial amount of hydrogen molecule which are originated from the oxyhydrogen flame treatment used for the production of silica ingot in the form of a solid solution. With respect to the so-called residual hydrogen molecules remaining in this silica glass ingot in the form of a solid solution, it has been found that the presence of the residual hydrogen molecules in the silica glass ingot, which is formed through the direct synthetic method, in the form of a solid solution serves to suppress any absorption of lights falling within the ultraviolet region if the concentration of hydrogen molecules dissolved is not less than $5 \times 10^{16}$ molecules/cm$^3$ (U.S. Pat. No. 5,086,352).

On the other hand, if the residual hydrogen molecules remain in the silica glass ingot in the form of a solid solution in a concentration of not more that $5 \times 10^{16}$ molecules/cm$^3$ there is not observed any effect of inhibiting the occurrence of absorption bands within the ultraviolet region, but it has been found that the occurrence of absorption bands within the ultraviolet region is rather liable to increase.

Nevertheless, the inventors of this invention have found out that the occurrence of absorption bands within the ultraviolet region can be suppresses if the residual hydrogen molecules remain in the silica glass ingot in the form of a solid solution in a concentration of not more that $1 \times 10^{16}$ molecules/cm$^3$.

Thus, according to the present invention, the foregoing synthetic silica glass is vitrified by heating it in an atmosphere maintained at a degree of vacuum of not less than $1 \times 10^{-2}$ Torr, i.e., at a pressure of not more than $1 \times 10^{-2}$ Torr and at a temperature ranging from, for instance, 1350 to 1700° C. The degree of vacuum and temperature for the vitrification of the synthetic silica glass into transparent glass are selected such that the OH groups and metallic impurities present in the synthetic silica glass are removed through volatilization and in particular, the heating temperature is preferably selected such that it falls within the range defined above and as low as possible, depending on the size of the porous ingot to be treated and the transparent-vitrification time.

The vitrification of the foregoing porous ingot of synthetic silica glass is caused through a dehydration-condensation reaction of silanol groups (SiOH) represented by the following reaction scheme:

$$2SiOH \rightarrow SiOSi + H_2O$$

The water molecules formed through the dehydration-condensation reaction of silanol groups diffuse from inside to outside through interstices between silica glass fine particles and are thus finally discharged out of the system. Therefore, the vitrification of the synthetic glass ingot into transparent glass must be performed during diffusion of the resulting water molecules through the interstices between the fine glass particles in order to remove OH groups.

Therefore, if the vitrification temperature exceeds 1700° C. during the reaction, the sintering reaction of the silica fine particles rapidly proceeds on the silica glass surface prior to substantial completion of the dehydration-condensation reaction. This results in the premature vitrification of the porous silica glass ingot into transparent glass and in turn OH groups are not removed and remain in the synthetic quartz glass.

On the other hand, the dehydration-condensation reaction of silanol groups proceeds at a temperature lower than the sintering temperature, for instance, about 800° C. For this reason, when OH groups are removed from the synthetic quartz glass, it is necessary to complete the dehydration-condensation reaction of silanol groups prior to the completion of the sintering of the fine particles of silica glasses so that the OH groups are removed through diffusion.

Thus, the removal of OH groups from the quartz glass is preferably carried out through two-stage vitrification of the porous silica glass ingot into transparent glass, which comprises maintaining the ingot at a temperature ranging from, for instance, 800 to 1200° C. over a predetermined time for promoting the dehydration-condensation reaction of silanol groups and then sintering the fine particles of silica glass to give transparent glass ingot.

Alternatively, the vitrification of the synthetic silica glass into transparent glass is performed by the zone melting method, the vitrification must be carried out under conditions such that the dehydration-condensation reaction of silanol groups is promoted as gently as possible. More specifically, the vitrification must be carried out while moving the ingot within a heating zone as slow as possible or the vitrification must be performed at a temperature as low as possible.

In general, it is preferred to decrease the traveling speed of the ingot within the heating zone as the size thereof increases.

It has been found that the vitrification treatment should be performed within an atmosphere maintained at a high degree of vacuum on the order of not less than $10^{-2}$ Torr to externally release, through diffusion, the water ($H_2O$) generated through the dehydration-condensation reaction of silanol groups during the vitrification as soon as possible. It is herein important that the dehydration-condensation reaction of silanol groups and the vitrification of the porous silica glass ingot into transparent glass should be carried out at a high degree of vacuum on the order of not less than $10^{-2}$ Torr, i.e., at a pressure of not more than $10^{-2}$ Torr. In this respect, if the porous ingot of silica glass to be treated has a large size, the amount of $H_2O$ generated is correspondingly increased to a substantial extent. Thus, it is effective to use a vacuum-exhaust device having a high evacuation speed rather than that having a high ultimate vacuum.

The synthetic quartz glass thus produced has a low OH group-content and more specifically the quartz glass has an OH group-content of not more than 50 ppm, preferably not more than 30 ppm and further the glass comprises quite small amount of metallic impurities. Thus, the quartz glass is transparent highly pure quartz glass.

The quartz glass produced by the CVD method comprises a heat-resistant substrate and a layer of silica glass fine particles deposited thereon and the deposit of the silica fine particles has a scattering of density due to temperature changes during the production thereof. The scattering of density becomes a cause of the formation of striae after the vitrification. Thus, the transparent quartz glass produced by the CVD method in general has a stria.

However, this stria must be removed if the transparent quartz glass produced by the CVD method is used for the production of optical members such as a stepper lense. In the present invention, the foregoing highly pure transparent quartz glass should be treated according to the method as disclosed in, for instance, U.S. Pat. Nos. 2,904,713; 3,128,166; 3,128,169 and 3,485,613 to remove the stria.

For instance, there has been known a method for removing such stria which comprises fitting a rod-like transparent synthetic quartz glass ingot having a stria to a turning machine, locally heating the quartz glass ingot with a burner or in an electric heater to a temperature of at least the softening point thereof and rotating the turning machine to give a twist to the rod-like transparent synthetic quartz glass ingot till the stria disappears.

According to this method, the removal of the stria is carried out by moving in order the rod-like synthetic quartz glass ingot along the heating means and ultimately the entire rod-like synthetic quartz glass ingot is homogenized. The temperature during the removal of the stria must be not less than the softening point of the quartz glass, for instance, not less than 1600° C. The moving speed of the synthetic quarts glass ingot along the heating means or the like are of course selected appropriately depending on the shape and weight of the quartz glass optical member to be treated.

The transparent synthetic quartz glass from which the stria is removed is then formed into a final article having a shape and size suitable for use as, for instance, a stepper lense. The molding is generally carried out by introducing the transparent synthetic quartz glass material from which the stria is removed into a crucible having a proper shape, heating it in a heating furnace to a temperature of at least 1500° C. At this stage, the quartz glass material causes deformation under its own weight. In this case, a crucible made of carbon can generally be used as in the conventional methods. In addition, a heating furnace may likewise be those made from carbon as in the conventional methods. For this reason, the molding is carried out in a vacuum or in an atmosphere of an inert gas such as He or $N_2$. The conditions for molding such as heating temperature and heating time are properly selected depending on the size and shape of the desired article to be formed.

In general, optical materials must have a strain of not more than 5 nm/cm. Therefore, it is necessary, in the present invention, to subject the molded transparent synthetic quartz glass to an annealing to eliminate the molding strain. The removal of the molding strain is performed by heating the molded transparent synthetic quartz glass to a temperature higher than the strain point of the quartz glass and then gradually cooling the molded transparent synthetic quartz glass.

In general, the strain point of the quartz glass is about 1025° C. In the present invention, therefore, the molded transparent synthetic quartz glass is heated to a temperature ranging from 1100 to 1250° C. and then gradually cooled to almost completely eliminate the molding strain. The slow cooling (annealing) is preferably carried out as slow as possible. In the present invention, this annealing treatment also serves to uniformize the refractive index distribution within the synthetic quartz glass.

The refractive index distribution in the synthetic quartz glass is mainly determined on the basis of the content of impurities such as OH groups and chlorine and the fictive temperature. Among these, the number of OH groups in the optical member of the synthetic quartz glass according to the present invention can be neglected since the content thereof is not more than 10 ppm and other impurities can substantially be neglected in case of the optical member of the synthetic quartz glass according to the present invention. Therefore, the establishment of the fictive temperature during the annealing treatment is very important. More specifically, the fictive temperature should be uniform throughout the molded synthetic quartz glass to be treated, i.e., the molded article of the synthetic quartz glass in order to ensure uniform refractive index distribution in the article. To this end, the molded article of the synthetic quartz glass is once heated to a temperature higher than the annealing temperature, followed by maintaining the article at that temperature over a predetermined time period to establish uniform temperature distribution within the article and then substantially slowly reducing the temperature thereof. This is required for preventing the occurrence of temperature difference throughout the molded article of the quartz glass. In this case, the use of a high rate of the temperature reduction arises temperature difference throughout the molded article, this in turn results in the establishment of different fictive temperature and any uniform refractive index distribution cannot be ensured.

In the present invention, the heating temperature during the foregoing annealing treatment is about 1200° C. and the heating time and the temperature reduction rate are appropriately selected while taking into consideration the size and shape of the molded article of the synthetic quartz glass to be annealed. In general, it is preferred to increase the heating temperature and to reduce the temperature reduction rate as the size of the molded article increases.

The optical member of the synthetic quartz glass according to the present invention has an OH group-content of 10 to 100 ppm and a chlorine-content of not more than 200 ppm. Thus, the total quantity of paramagnetic defects generated through the irradiation with ultraviolet rays can be reduced and the optical member can ensure estable optical properties over a long time period under irradiation with lights from excimer lasers.

Moreover, the optical member of the synthetic quartz glass for excimer lasers according to the present invention has a refractive index distribution ($\Delta n$) of not more than $5 \times 10^{-6}$ as determined on the light transmitting-plane thereof and, therefore, the part has stability against the lights from excimer lasers which is uniform throughout the optical member even under the irradiation with the lights from the excimer lasers.

According to the present invention, an optical member made from synthetic quartz glass is produced by a method which comprises the steps of flame-hydrolyzing a volatile silicon compound using an oxyhydrogen flame to form fine silica particles, depositing the fine synthetic silica particles on a heat-resistant substrate to give a porous ingot of the synthetic silica glass, heating the porous ingot of the synthetic silica glass at a high degree of vacuum on the order of not less than $1 \times 10^{-2}$ Torr to thus vitrify the ingot into a transparent synthetic quartz glass material, then homogenizing the transparent synthetic quartz glass to give highly uniform quartz glass free of stria in at least one direction, preferably three directions thereof, molding the resulting highly uniform synthetic quartz glass and annealing the molded quartz glass article. Therefore, the resulting optical member of the synthetic quartz glass has only a small number of intrinsic defects which become a cause of paramagnetic defects generated through irradiation with ultraviolet rays, for instance, intrinsic defects formed due to other impurities such as SiOH and chlorine and as a result, the occurrence of the paramagnetic defects is suppressed.

As has been discussed above, the quartz glass material for excimer lasers produced according to the present invention has good uniformity and excellent resistance to lights from excimer lasers. Therefore, it is suitable for use as, in particular, quartz glass for stepper lenses provided with an excimer laser as a light source. Moreover, the optical member of the invention makes it possible to prevent an increase in absorption within the ultraviolet region observed when irradiating it with ultraviolet rays.

BEST MODE FOR CARRYING OUT THE INVENTION

The embodiments of the present invention will hereinafter be explained with reference to the following Examples, but the present invention is not limited by the following description and Examples at all.

EXAMPLE 1

A porous synthetic silica deposit (1KG) was produced by introducing silicon tetrachloride into an oxyhydrogen flame to form fine silica particles through flame-hydrolysis of the silicon tetrachloride and depositing the resulting fine silica particles on a rotating target. The resulting porous synthetic silica deposit was introduced into an atmospheric furnace, heated up to 800° C., heat-treated for 10 hours while maintaining at that temperature and introducing a 1:1:8 gas mixture of chlorine, oxygen and nitrogen at a flow rate of 10 1/min, followed by withdrawing the porous synthetic silica from the furnace, then introducing it into a vacuum furnace, raising the temperature to 1600° C. at a vacuum of $1 \times 10^{-2}$ Torr, maintaining it at that temperature over 1 hour and cooling it to Give a transparent rod-like synthetic quartz glass material.

The synthetic quartz glass material was then uniformized by fitting both ends of the glass material to a turning machine and heating it to a temperature of not less than the softening point thereof with a propane gas burner while rotating the turning machine. The uniformized synthetic quartz glass material was placed in a graphite mold, heated at 1700° C. in a nitrogen gas atmosphere to mold it and then annealed in the air. The annealing was performed by maintaining the molded article at 1100° C. for 20 hours and then slowly cooling down to 600° C. at a temperature reduction rate of 0.5°

C./min. After cutting a sample, for the subsequent analysis, from the resulting synthetic quartz glass molded article, the outer periphery thereof was ground and the edge thereof was subjected to mirror polishing to thus give a synthetic quartz molded article for optical window having an outer diameter of 80 mm and a thickness of 20 mm.

Figure 1:
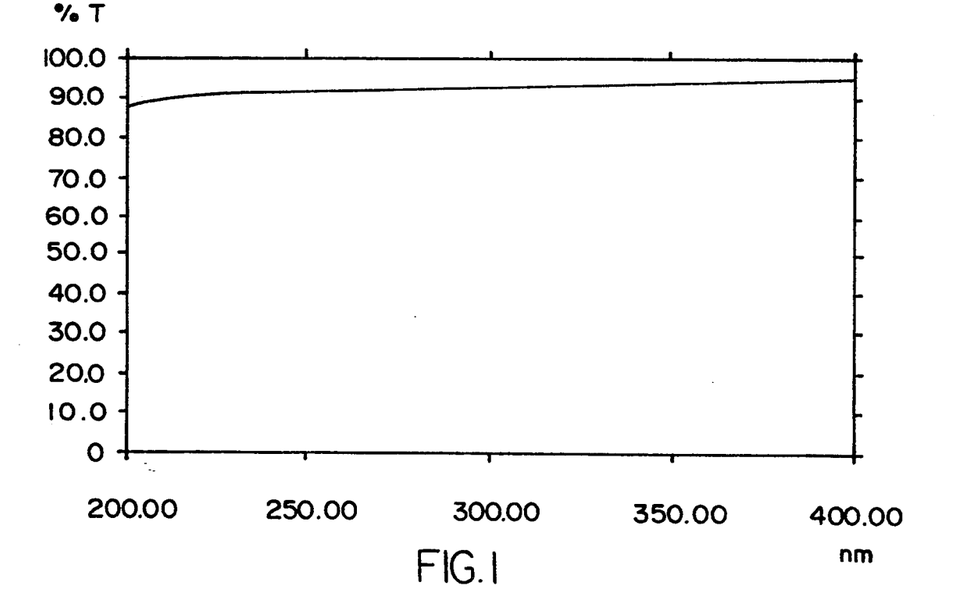
FIG. 1 is a graph showing a transmittance curve in the ultraviolet region observed for a sample (having a thickness of 10 mm) of the synthetic quartz glass molded article for optical windows produced in Example 1 of the present invention.

The OH group-content of the resulting synthetic quartz glass molded article for the optical window of excimer lasers was determined by infrared spectrophotometric analysis and was found to be 20 ppm. In addition, the concentration of the residual hydrogen molecules was determined by the Raman scattering method and was found to be not more than $1 \times 10^{16}$ molecules/cm$^3$. Moreover, the ultraviolet transmittance of the synthetic quartz glass molded article for optical window was determined by ultraviolet spectrophotometer and as a result, any absorption at 245 nm was not observed and the internal transmittance thereof was found to be not less than 99%. The transmittance curve observed for the synthetic quartz glass molded article for optical window according to Example 1 is shown in FIG. 1. The internal transmittance is defined to be a value obtained by subtracting a loss due to reflection by the sample from the transmittance shown in FIG. 1 and then reducing the resulting transmittance to that for the sample having a thickness of 1 cm.

Moreover, the chlorine-content of the sample was determined by decomposing the sample for analysis with hydrofluoric acid and then subjecting the decomposed product to silver nitrate-nephelometric analysis and was found to be 100 ppm.

Figure 2:
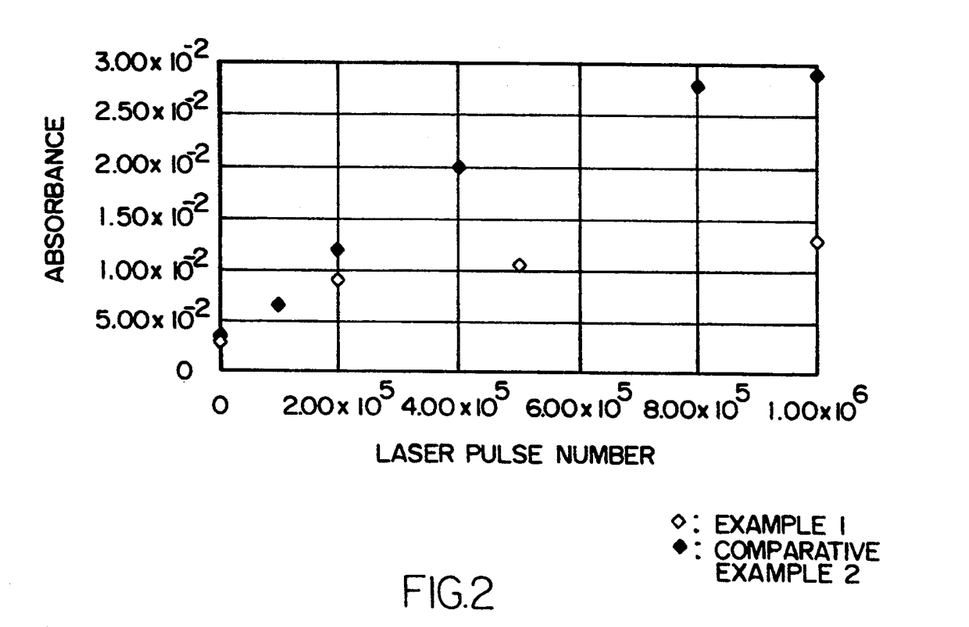
FIG. 2 is a graph showing changes of absorbance at a wavelength of 248 nm observed for the synthetic quartz glass molded articles for optical windows produced in Example 1 of the present invention and Comparative Example 1 respectively.

Further, the refractive index distribution of the synthetic quartz glass molded article for optical window was determined using a Fizeau interferometer and lights from an HeNe laser according to the oil-on-plate method and found to be $1 \times 10^{-6}$ as expressed in terms of $\Delta n$ and the birefringence was found to be 2 nm. The synthetic quartz glass molded article for optical window was irradiated with the light rays from a KrF excimer laser at a fluence of 500 mJ/cm$^2$p, 100 Hz to determine the changes of absorption in the ultraviolet region. The results thus obtained are shown 20 in FIG. 2. FIG. 2 shows changes in shot numbers of absorbance ($-$log(internal absorption)) with time at a wavelength of 215 nm, which is the wavelength of light absorbed by E' center.

The synthetic quartz glass molded article for optical window has properties suitable for use as an optical member since it has a small change in the absorbance observed upon irradiation with the lights from an excimer laser as compared with that observed in Comparative Example 1 as will be described below.

In this Example, the concentration of the residual hydrogen molecules present in the synthetic quartz glass was determined by the Raman scattering method (Zhurnal Prikladnoi Spektroskopii, vol. 46, No. 6, pp. 987–991, June 1987). According to this method, the concentration of the residual hydrogen molecules present in the synthetic quartz glass is determined on the basis of the ratio of the intensity of the Raman band at a wave number of 800 cm$^{-1}$ ascribed to SiO$_2$ to the intensity of the band at 4135 cm$^{-1}$ ascribed to the hydrogen molecules present in the synthetic quartz glass and the concentration C of hydrogen molecules can be calculated from the following equation (1):

$$C = k I_{4135}/I_{800} \qquad (1)$$

(In Equation (1), $I_{4135}$ is the area intensity of the Raman band at 4135 cm$^{-1}$, $I_{800}$ is the area intensity of the Raman band at 800 cm$^{-1}$, k is a constant and equal to $1.22 \times 10^{21}$)

The hydrogen molecule concentration as determined by this equation is expressed in terms of the number of hydrogen molecules per unit volume of 1 cm$^3$.

The apparatus used in the present invention for the determination of the hydrogen molecule concentration is a Raman scattering spectrophotometer NR-1100 double Monochro Type available from Nippon Bunko Co., Ltd., the detector used is a photomultiplier R943-02 available from Hamamatsu Photonics Co., Ltd. and the laser used is an Ar ion laser (488 nm).

EXAMPLE 2

A porous synthetic silica deposit produced in the same manner used in Example 1 was heat-treated in an atmospheric furnace maintained at 800° C. for 10 hours while supplying a 1:2:7 mixed gas of chlorine, oxygen and nitrogen at a flow rate of 10 l/min, followed by withdrawing the porous synthetic silica, introducing it into a vacuum furnace in which it was heated to 1600° C. at a vacuum of $1 \times 10^{-2}$ for one hour and then cooling to give a transparent rod-like synthetic quartz glass material. The resulting synthetic quartz glass material was molded and annealed in the same manner used in Example 1 to give a sample for analysis and a synthetic quartz glass molded article for an optical window of excimer lasers having an outer diameter of 80 mm and a thickness of 20 mm.

The resulting synthetic quartz glass molded article for an optical window of excimer lasers had an OH group-content of 90 ppm and a chlorine-content of 20 ppm. In addition, the synthetic quartz glass molded article for an optical window had an internal transmittance as determined at 245 nm of not less than 99%. The synthetic quartz glass molded article for an optical window was irradiated with the lights from a KrF laser to determine the changes in absorbance at 248 nm under the same conditions used in Example 1 and the results identical to those observed in Example 1 were obtained. This indicates that the synthetic quartz glass molded article has good stability to the laser rays.

EXAMPLE 3

A transparent synthetic quartz glass produced in the same manner used in Example 1 was treated in the same manner used in Example 1 except that the time for uniformizing was reduced to half to give a sample for analysis and a synthetic quartz glass molded article for an optical window having an outer diameter of 80 mm and a thickness of 20 mm. The resulting synthetic quartz glass molded article for an optical window of excimer lasers had an OH group-content of 90 ppm and a chlorine-content of 20 ppm. In addition, the synthetic quartz glass molded article for an optical window also had an internal transmittance as determined at 245 nm of not less than 99% and the birefringence thereof was 2 nm.

Figure 3:
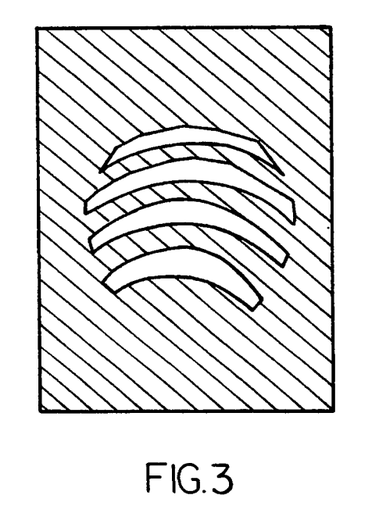
FIG. 3 is a diagram showing interference fringes which reflect the refractive index distribution observed for the synthetic quartz glass molded article for optical windows produced in Example 3 of the present invention.
Figure 4:
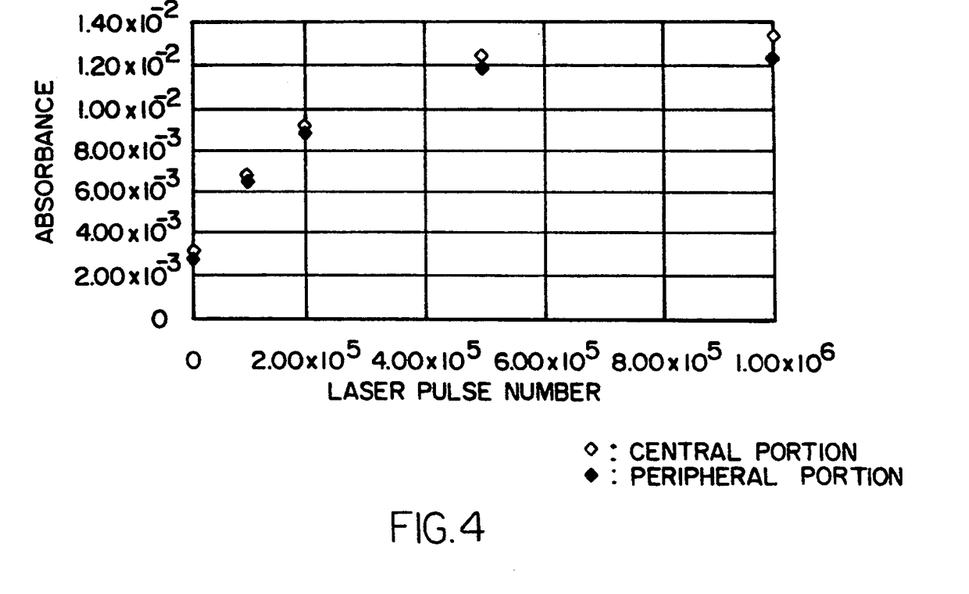
FIG. 4 is a graph showing changes of absorbance at a wavelength of 248 nm observed for the central and peripheral portions of the synthetic quartz glass molded article for optical windows produced in Example 3 of the present invention.

The refractive index distribution of the synthetic quartz glass molded article for optical window was found to be $5 \times 10^{-6}$ as expressed in term of $\Delta n$. The interference fringes which reflect the refractive index distribution of the article is shown in FIG. 3. Samples each having a size of 10 mm$\times$10 mm$\times$40 mm were cut from the central portion and the peripheral portion of the synthetic quartz glass molded article for optical windows, respectively and each sample was irradiated with the lights from a KrF laser under the same conditions used in Example 1 to determine the changes in absorbance at 248 nm. The results obtained are shown in FIG. 4. Both the central and peripheral portions showed good stability and identical absorbance changes. This indicates that the molded article has uniformity sufficient for use as an optical member.

COMPARATIVE EXAMPLE 1

A porous synthetic silica deposit produced in the same manner used in Example 1 was directly introduced into a vacuum furnace in which it was heated to 1600° C. at a vacuum of $1 \times 10^{-2}$ for one hour and then cooling to give a transparent rod-like synthetic quartz glass material. The resulting synthetic quartz glass material was treated in the same manner used in Example 1 to give a sample for analysis and a synthetic quartz glass molded article for an optical window of excimer lasers having an outer diameter of 80 mm and a thickness of 20 mm. The resulting optical window had an OH group-content of 200 ppm and a chlorine-content of 10 ppm. In addition, the synthetic quartz glass molded article for an optical window also had an internal transmittance as determined at 245 nm of not less than 99%. The synthetic quartz glass molded article for optical windows was irradiated with light from a KrF laser under the same conditions used in Example 1 to determine the changes in absorbance at 248 nm. The results obtained are shown in FIG. 2 together with the results obtained in Example 1. The sample of Comparative Example 1 exhibits an increase in the absorbance at 215 nm unlike the sample of Example 1. This indicates that the synthetic quartz glass molded article for optical window does not have stability sufficient for use as an optical member for excimer lasers.

COMPARATIVE EXAMPLE 2

A porous synthetic silica deposit produced in the same manner used in Example 1 was heat-treated in an atmospheric furnace maintained at 800° C. for 5 hours while supplying a 1:9 mixed gas of chlorine and nitrogen at a flow rate of 10 l/min, followed by withdrawing the porous synthetic silica, introducing it into a vacuum furnace in which it was heated to 1600° C. at a vacuum of $1 \times 10^{-2}$ for one hour and then cooling to give a transparent rod-like synthetic quartz glass material. The resulting synthetic quartz glass material was molded and annealed in the same manner used in Example 1 to give a sample for analysis and a synthetic quartz glass molded articles for an optical window having an outer diameter of 80 mm and a thickness of 20 mm.

Figure 5:
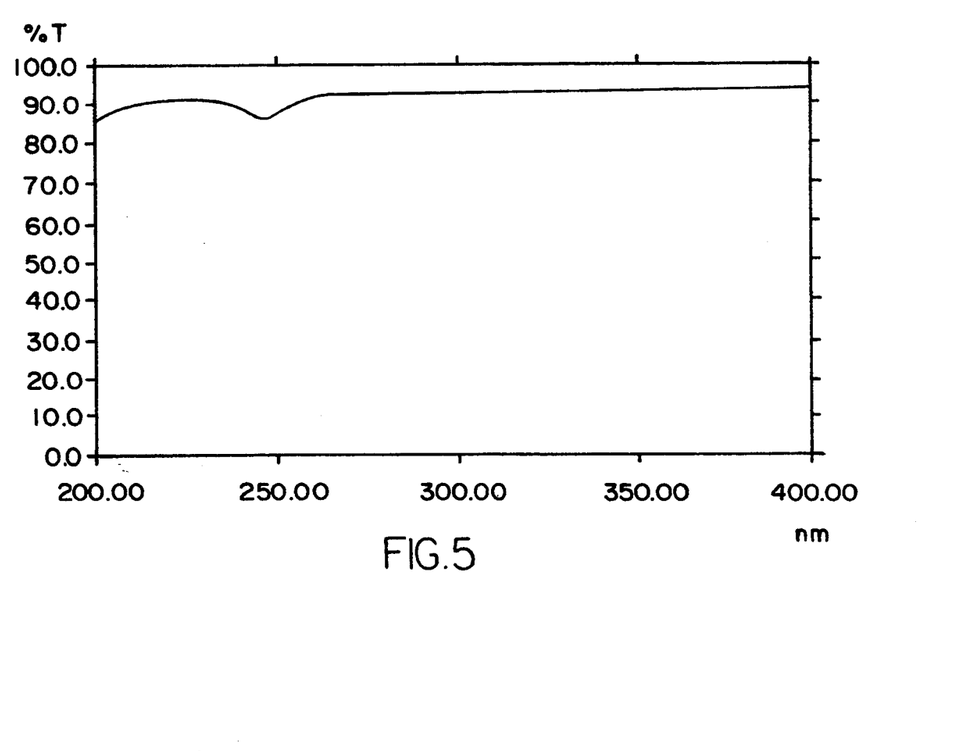
FIG. 5 is a graph showing a transmittance curve in the ultraviolet region observed for a sample (having a thickness of 1.0 cm) of the synthetic quartz glass molded article for optical windows produced in comparative Example 2.

The resulting synthetic quartz glass molded article for an optical window had an OH group-content of 1 ppm and a chlorine-content of 400 ppm. In addition, the synthetic quartz glass molded article for an optical window had an internal transmittance as determined at 245 nm of 94.7%. The transmittance curve, in the ultraviolet region, observed for the synthetic quartz glass molded article for optical window is shown in FIG. 5 which shows the appearance of an absorption band having an absorption center at 245 nm.

Figure 6:
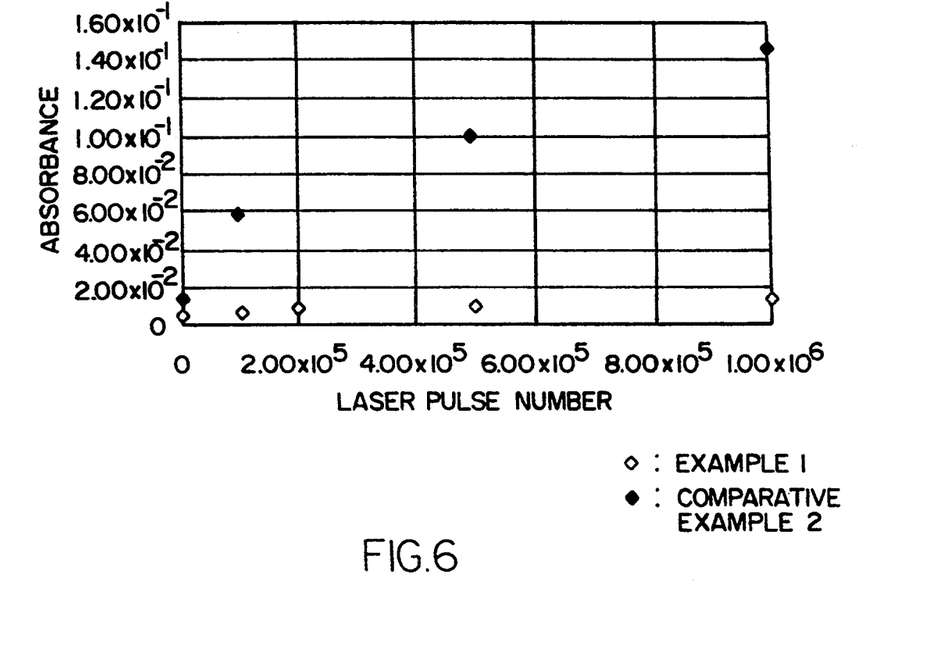
FIG. 6 is a graph showing changes of absorbance at a wavelength of 248 nm observed for the synthetic quartz glass molded articles for optical windows produced in Example 1 of the present invention and comparative Example 2 respectively.

The synthetic quartz glass molded article for optical window was irradiated with lights from a KrF laser to determine the changes in absorbance at 215 nm under the same conditions used in Example 1 and the results obtained are shown in FIG. 6 together with the results obtained in Example 1. There was observed an abrupt increase in the absorbance at 248 nm. This indicates that the synthetic quartz glass molded article for optical window does not have stability sufficient for use as an optical member for excimer lasers.

EXAMPLE 4

After distilling silicon tetrachloride to remove impurities, a cylindrical porous synthetic quartz glass ingot having an outer diameter of 150 mm and a length of 600 mm was produced by the CVD method using the distilled silicon tetrachloride as a starting material. The resulting porous synthetic quartz glass ingot was introduced into a vacuum furnace provided with a carbon heater and the furnace was evacuated to $10^{-5}$ Torr. Then the porous synthetic quartz glass ingot was heated by operating a heater. The heating operation was carried out according to the following heating program: up to 800° C., at a heating rate of 10° C./min; 800° C. to 1400° C., at a heating rate of 1° C./min. Then the heating was interrupted when the temperature reached 1400° C. to allow spontaneous cooling of the ingot. Thus, there was obtained a cylindrical transparent synthetic quartz glass material having an outer diameter of 105 mm and a length of 550 mm. The OH group-content of the resulting transparent synthetic quartz glass material was about 25 ppm.

Supporting rods of quartz glass were fitted to both ends of the cylindrical transparent synthetic quartz glass material and fixed to the chucks of a turning machine. The transparent glass portion produced from the porous synthetic quartz glass ingot was heated by a propane gas burner, followed by giving a twist to the transparent glass portion while rotating the turning machine. The temperature during this processing was about 2000° C. The twisted transparent glass portion was free of stria in the three directions.

Thereafter, the transparent glass portion was cut from the ingot, molded in a heating furnace provided with a carbon heater into cylindrical synthetic quartz glass molded article having an outer diameter of 250 mm and a length of 75 mm. The molding was carried out at about 1700° C. in a nitrogen gas atmosphere.

The synthetic quartz glass molded article was then annealed to remove strains. The annealing was performed by raising temperature up to 1100° C. and then reducing the temperature down to 600° C. at a temperature reduction rate of 0.1° C./min. The heating process was performed in the air. The resulting synthetic quartz glass molded material had a birefringence of not more than 2 nm/cm, a substantially uniform refractive index distribution and a difference between the maximum and minimum of the refractive indices of not more than $1 \times 10^{-6}$. Moreover, the concentration of the residual hydrogen molecules present in the synthetic quartz glass material was determined by the Raman scattering method and found to be not more than $1 \times 10^{16}$ molecules/cm$^3$.

To examine whether or not the quartz glass molded article forms paramagnetic defects upon irradiation with ultraviolet rays, a part of the transparent quartz glass molded article was cut and the interfacial planes were polished to give a transparent synthetic quartz glass molded article having a size of 10 mm $\times$ 10 mm $\times$ 40 mm. The synthetic quartz glass molded article was irradiated with the lights from an ArF laser to examine changes in the absorbance at 193 nm. The irradiation with the ArF laser is carried out at an energy density of 200 mJ/cm$^2$ pulse and a frequency of 100 Hz.

Figure 7:
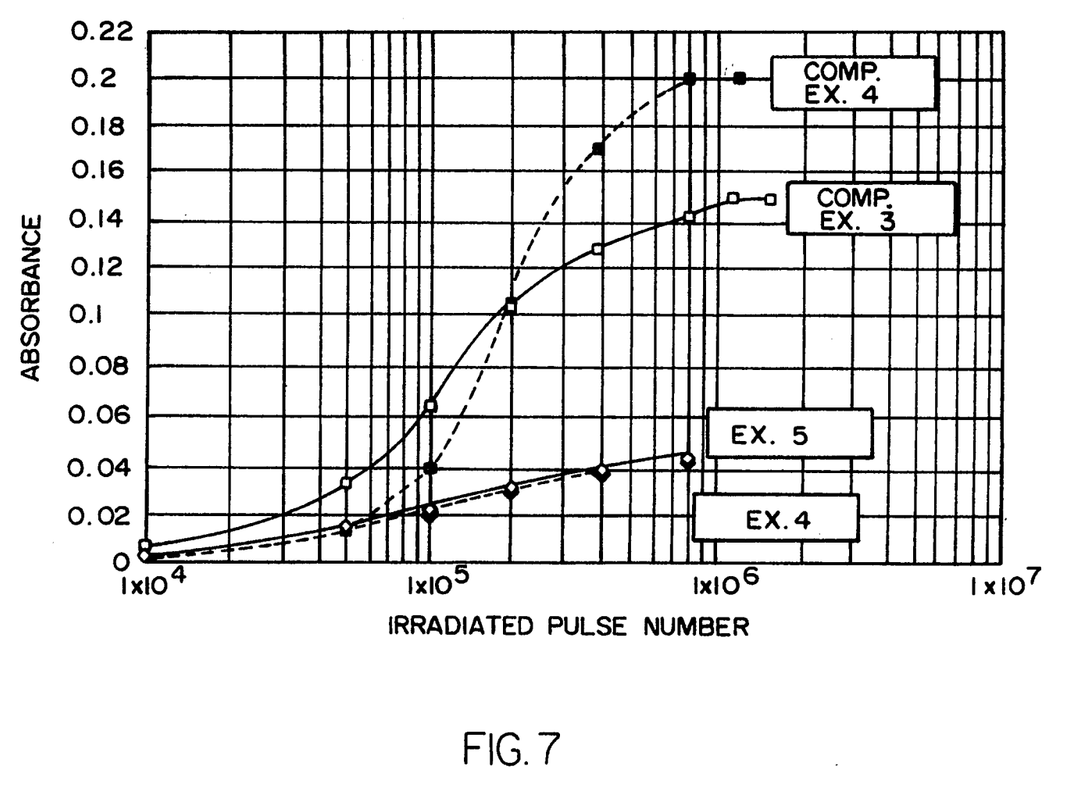
FIG. 7 is a graph showing absorption curves at 193 nm as a function of irradiated pulse numbers of an ArF laser observed in Examples 4 and 5 of the present invention and Comparative Examples 3 and 4.

The intensities of the absorption at 193 nm are plotted on FIG. 7 against the number of irradiated pulses of the ArF laser. The intensity on the ordinate is expressed in terms of absorbance ($-\log$(internal transmittance)) per unit thickness (1 cm) of the sample.

EXAMPLE 5

After distilling silicon tetrachloride to remove impurities, a cylindrical porous synthetic quartz glass ingot having an outer diameter of 70 mm and a length of 600 mm was produced by the CVD method using the distilled silicon tetrachloride as a starting material. The resulting porous synthetic quartz glass ingot was introduced into a vacuum furnace provided with a carbon heater and the furnace was evacuated to $10^{-5}$ Torr. Then the ingot was heated by operating a heater. The heating operation was carried out according to the following heating program: up to 800° C., at a heating rate of 10° C./min; 800° C. to 1400° C., at a heating rate of 1° C./min. Then the heating was interrupted when the temperature reached 1400° C. to allow spontaneous cooling of the ingot. Thus, there was obtained a cylindrical transparent synthetic quartz glass material having an outer diameter of 50 mm and a length of 550 mm. The OH group content of the resulting transparent synthetic quartz glass material was about 15 ppm.

The cylindrical transparent synthetic quartz glass material was uniformized in the same manner used in Example 4. Thereafter, the transparent glass portion was cut from the ingot, molded in a heating furnace provided with a carbon heater into cylindrical synthetic quartz glass molded article having an outer diameter of 120 mm and a length of 80 mm. The molding was carried out at about 1700° C. in a nitrogen gas atmosphere.

The synthetic quartz glass molded article was then annealed to remove strains. The annealing was performed by raising temperature up to 1100° C. and then reducing the temperature down to 600° C. at a temperature reduction rate of 0.2° C./min. The heating process was performed-in the air. The resulting synthetic quartz glass molded material had a birefringence of not more than 2 nm/cm, a substantially uniform refractive index distribution and a difference ($\Delta n$) between the maximum and minimum of the refractive indices of not more than $0.8 \times 10^{-6}$.

The synthetic quartz glass of this Example was irradiated with the lights from an ArF laser to examine changes in the absorbance at 193 nm under the same conditions used in Example 4. The results obtained are summarized and shown in FIG. 7.

COMPARATIVE EXAMPLE 3

A porous synthetic quartz glass ingot produced in the same manner used in Example 4 was introduced into a furnace made of carbon and converted into transparent glass in a He gas atmosphere. The heating operation was carried out by raising the temperature up to 1600° C. at a heating rate of 10° C./min, the heating was interrupted when the temperature reached 1600° C. to allow spontaneous cooling of the ingot. The OH content of the resulting transparent synthetic quartz glass material was about 300 ppm. Thereafter, the glass material was uniformized, molded and annealed under the same conditions used in Example 1. The birefringence and refractive index distribution thereof were approximately identical to those observed for the synthetic quartz glass prepared in Example 1. The synthetic quartz glass of this Example was irradiated with lights from an ArF laser under the same conditions used in Example 4 to determine the change of transmittance at 193 nm. The results obtained are summarized in FIG. 7.

COMPARATIVE EXAMPLE 4

Evaluation of a commonly used synthetic quartz glass molded article for optical use was performed by irradiating it with the lights from an ArF laser under the same conditions used in Example 1. This commonly used synthetic quartz glass molded article was one prepared from the synthetic quartz glass synthesized by a direct flame-hydrolysis (direct method using an oxyhydrogen flame) of silicon tetrachloride. The OH content of this glass was about 900 ppm. The glass material was uniformized, molded and annealed under the same conditions used in Example 1. The birefringence and refractive index distribution thereof were approximately identical to those observed for the synthetic quartz glass prepared in Example 1. In addition, the concentration of hydrogen molecules remaining in the synthetic quartz glass was determined by the Raman scattering method and found to be $3 \times 10^{16}$ molecules/cm$^3$. The synthetic quartz glass of this Comparative Example was irradiated with the lights from an ArF laser under the same conditions used in Example 4 to determine the change of transmittance at 193 nm. The results obtained are summarized in FIG. 7 together with the results obtained in Examples 4 and 5.

The glass materials prepared in Examples 4 and 5 and Comparative Examples 3 and 4 exhibit approximately the same birefringences and refractive index distributions. Regarding the resistance to irradiation with ArF laser rays as seen from FIG. 7, those of Examples 4 and 5 exhibit increases of absorbance, but the increase in absorbance is substantially suppressed as compared with those observed for Comparative Examples 3 and 4. In particular, the increases in absorbance observed in Examples 4 and 5 are about 1/4 time that observed for Comparative Example 4. This indicates that the optical members of Examples 4 and 5 form only a small number of paramagnetic defects which generate through the irradiation with ArF laser rays and that the vitrification into transparent glass in a vacuum atmosphere can ensure the production of glass stable against the irradiation with excimer laser rays.

The glass materials obtained in these Examples and Comparative Examples except for Comparative Example 4 had a hydrogen molecule concentration of $1 \times 10^{16}$ molecules/cm$^3$. The refractive index distribution $\Delta n$'s were $1 \times 10^{-6}$ for Example 2, $1 \times 10^{-6}$ for Comparative Example 1 and $5 \times 10^{-6}$ for Comparative Example 2. The chlorine-contents were 10 ppm for Examples 4 and 5 and Comparative Example 3 and 80 ppm for Comparative Example 4.

INDUSTRIAL APPLICABILITY

The synthetic quartz glass optical member according to the present invention has an OH group-content ranging from 10 to 100 ppm, a chlorine-content of not more than 200 ppm, a uniformity of refractive index distribution as expressed in terms of $\Delta n$ of $5 \times 10^{-6}$ and a birefringence of not more than 5 nm/cm. Therefore, the optical member can be used under a long term irradiation with the lights from excimer lasers without causing reduction of light transmittance unlike the conventional synthetic quartz glass optical members. Thus, the optical member of the invention can be used in, for instance, lithography apparatuses for semiconductors over a long time period, this in turn permits a decrease of the number of exchanges of the optical member and stable exposure procedures and this ensures improvement of the semiconductor lithography-efficiency.

Moreover, the synthetic quartz glass optical member for excimer lasers according to the present invention has a refractive index distribution $\Delta n$ of not more than $5 \times 10^{-6}$ and, therefore, permits uniform transmission of the lights from ultraviolet lasers throughout the optical member under irradiation with lights from excimer lasers, which has never been achieved by the conventional synthetic quartz glass optical members. Accordingly, the optical member allows uniform exposure over a long time period in, for instance, semiconductor lithography apparatuses and ensures improvement of the yield of semiconductor lithography.

In the present invention, the quartz glass optical member for excimer lasers is produced by flame-hydrolyzing a highly pure volatile silicon compound such as highly pure silicon tetrachloride with an oxyhydrogen flame, depositing the fine silica particles formed through the decomposition on a heat-resistant substrate to give a porous ingot of silica glass, heating the porous ingot of silica glass at a high degree of vacuum on the order of $1 \times 10^{-2}$ Torr to form transparent quartz glass, uniformizing the transparent quartz glass to give highly uniform quartz glass free of stria in at least one direction thereof, molding the highly uniform quartz glass and then annealing the molded article. Therefore, contamination with impurities can substantially be prevented as compared with the conventional quartz glass parts for excimer lasers and the resulting glass has a low density of intrinsic defects. As a result, the present invention makes it possible to suppress the formation of paramagnetic defects during irradiation with the lights from excimer lasers as compared with the conventional methods and can provide quartz glass having excellent resistance to the lights from excimer lasers.

What is claimed is:

1. A method for producing an optical member for excimer lasers made from synthetic quartz glass which has an OH group-content ranging from 10 to 100 ppm, a chlorine-content of not more than 200 ppm, a hydrogen molecule-content of not more than $1 \times 10^{16}$ molecules/cm$^3$, a uniformity of refractive index distribution of not more than $5 \times 10^{-6}$ as expresses in terms of $\Delta n$ wherein $\Delta n$ represents the refractive index difference between the maximum index and the minimum index, and a birefringence of not more than 5 nm/cm, comprising the steps of:

flame-hydrolyzing a volatile silicon compound using an oxyhydrogen flame to form fine silica particles;

depositing the fine silica particles on a heat-resistant substrate to give a porous silica ingot;

dehydrating and degasifying by heating the porous silica ingot at a temperature of not less than 1400° C. and a high degree of vacuum on the order of not less than $1 \times 10^{-2}$ Torr, wherein said dehydrating and degasifying steps occur either sequentially or simultaneously;

uniformizing the dehydrated and degasified transparent quartz glass to give highly uniform quartz glass free of stria in at least on direction thereof;

molding the resulting highly uniform quartz glass; and annealing the molded quartz glass article.

2. The method for producing an optical member for excimer lasers made from synthetic quartz glass as set forth in claim 1 wherein the uniformizing treatment of the quartz glass is carried out at a temperature of not less than 1600° C.

3. The method for producing an optical member for excimer lasers made from synthetic quartz glass as set forth in claim 1 wherein the molding of the highly uniform quartz glass is carried out at a temperature of not less than 1500° C.

4. The method for producing an optical member for excimer lasers made from synthetic quartz glass as set forth in claim 1 wherein the annealing is carried out at a temperature ranging from 800 to 1250° C.

* * * * *

UNITED STATES PATENT AND TRADEMARK OFFICE
CERTIFICATE OF CORRECTION

PATENT NO. : 5,364,433
DATED : November 15, 1994
INVENTOR(S) : Hiroyuki Nishimura, et al.

It is certified that error appears in the above-indentified patent and that said Letters Patent is hereby corrected as shown below:

Column 2, line 64: "SIC1" should read --SiCl--
Column 4, line 36: "OH" should read --OH--
Column 5. lines 31 & 41: "Glass" should read --glass--.
Column 6, line 45: "OH" should read --OH--
Column 7, line 34: "OH" should read --OH--
Column 10, line 56: "Give" should read --give--
Column 11, line 43: delete "20"
Column 15, line 40: "performed-in" should read --performed in--.
Column 18, line 5, Claim 1: "expresses" should read --expressed--.

Signed and Sealed this

Twentieth Day of June, 1995

Attest:

BRUCE LEHMAN

Attesting Officer

Commissioner of Patents and Trademarks